United States Patent [19]

Iwasaki

[11] Patent Number: 5,143,856
[45] Date of Patent: Sep. 1, 1992

[54] METHOD OF MANUFACTURING MES FET

[75] Inventor: Hiroshi Iwasaki, Yokohama, Japan

[73] Assignee: Kabushiki Kaisha Toshiba, Kawasaki, Japan

[21] Appl. No.: 238,995

[22] Filed: Aug. 29, 1988

Related U.S. Application Data

[63] Continuation of Ser. No. 46,161, May 5, 1987, abandoned.

[30] Foreign Application Priority Data

May 9, 1986 [JP] Japan .................. 61-104693

[51] Int. Cl.⁵ ......................................... H01L 21/338
[52] U.S. Cl. ........................................ 437/22; 437/39; 437/41; 437/177; 437/185; 148/DIG. 105; 148/DIG. 140
[58] Field of Search ..................... 437/22, 39, 40, 41, 437/126, 130, 177, 176, 185, 104, 107; 148/DIG. 105, DIG. 140, DIG. 142, DIG. 72; 357/22 I, 22 J

[56] References Cited

U.S. PATENT DOCUMENTS

| | | | |
|---|---|---|---|
| 4,330,343 | 5/1982 | Christou et al. | |
| 4,546,540 | 10/1985 | Ueyanagi et al. | 437/22 |
| 4,581,076 | 4/1986 | Badawi | 437/41 |
| 4,601,095 | 7/1986 | Kikuchi et al. | 437/18 |
| 4,642,879 | 2/1987 | Kawata et al. | 437/22 |
| 4,675,709 | 6/1987 | Scifres et al. | 148/DIG. 72 |
| 4,735,913 | 4/1988 | Hayes | 437/177 |

FOREIGN PATENT DOCUMENTS 0112657 7/1984 European Pat. Off.
0123926 11/1984 European Pat. Off.
62-73673 4/1987 Japan.

OTHER PUBLICATIONS

Levy et al., "Self-Aligned Submicron Gate Digital GaAs Integrated Circuits", IEEE Electron Device Letters, vol. EDL-4, No. 4, Apr. 1983, pp. 102-104.
Abe et al., "New Technology Towards GaAs LSI/VLSI for Computer Applications", IEEE Trans. on Electron Devices, vol. ED-29, No. 7, Jul. 1982, pp. 1088-1094.
P. E. Luscher et al., "Automated Molecular Beams Grow Thin Semiconducting Films", *Electronics Internatinal*, vol. 53, No. 19, Aug. 28, 1990, pp. 160-168.
T. Ishida et al., "GaAs MESFET Ring Oscillator On Si Substrate", *IEEE Transactions on Electron Devices*, vol. ED-32, No. 6, Jun. 1985, pp. 1037-1041.
Ghandhi, *VLSI Fabrication Principles*, New York: John Wiley and Sons, Inc., 1983, pp. 330-337, 437-439.

Primary Examiner—Mary Wilczewski
Attorney, Agent, or Firm—Finnegan, Henderson, Farabow, Garrett & Dunner

[57] ABSTRACT

A GaAs epitaxial layer is formed on a semi-insulative GaAs substrate by use of a crystal growth technique which allows control on the order of atomic layer level. A metal film is formed on the GaAs epitaxial layer by use of the same crystal growth technique. Ions are implanted in source and drain high-concentration layer-forming regions, through the metal film, and are activated.

3 Claims, 4 Drawing Sheets

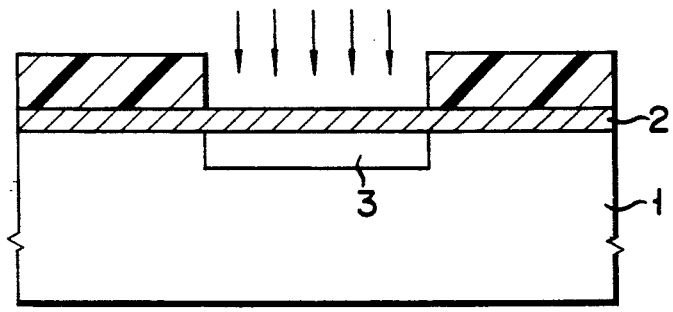
F I G. 1A
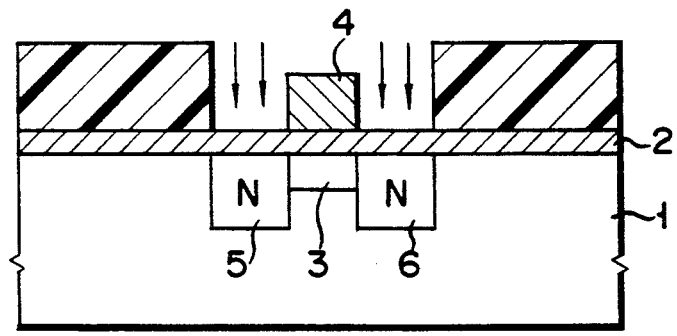
F I G. 1B
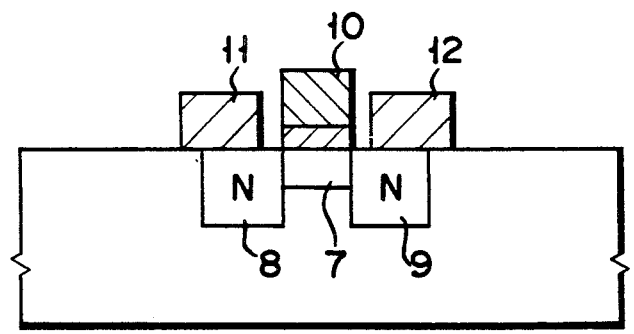
F I G. 1C

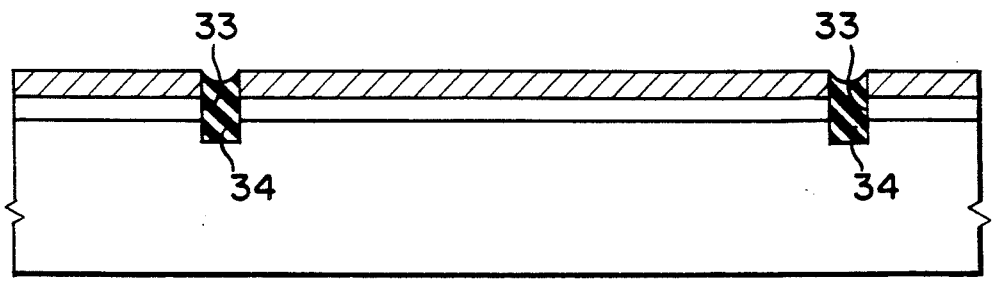
F I G. 3
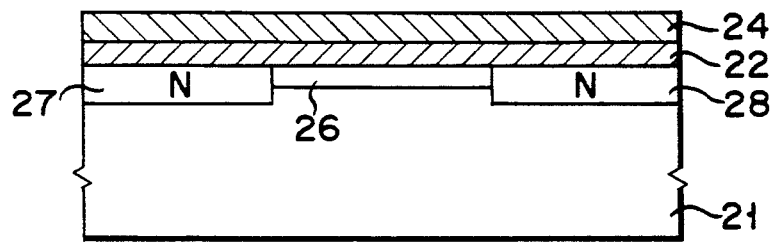
F I G. 4A
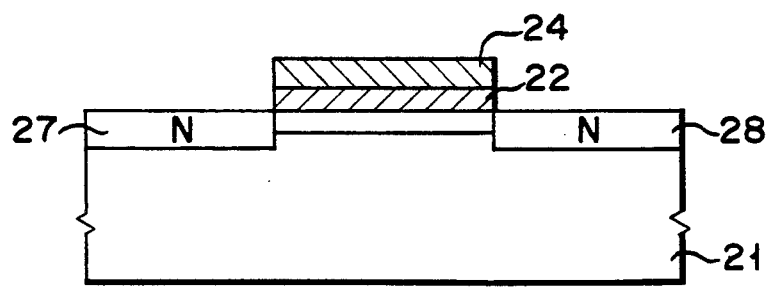
F I G. 4B

METHOD OF MANUFACTURING MES FET

This application is a continuation of application Ser. No. 046,161, filed May 5, 1987 now abandoned.

BACKGROUND OF THE INVENTION

The present invention relates to a method of manufacturing a GaAs (Gallium Arsenide) MES (Metal-Semiconductor) FET (Field-Effect Transistor) and, more particularly, to an improvement in a method of forming a channel layer and a gate electrode.

Since electron mobility in a GaAs substrate of a GaAs MES FET is greater than in an Si (silicon) substrate, therefore, the GaAs MES FET has become widely utilized as a high-frequency element whose operation speed must be high, or as an active element for a logic circuit IC. However, demand has increased for an improved method of manufacturing the GaAs MES FET.

Various methods of manufacturing the GaAs MES FET have been proposed. The principal procedures of the manufacturing method proposed by the present inventor and others (Japanese Patent Application No. 60-212201) will now be described, with reference to FIGS. 1A to 1C.

FIG. 1A

First metal film 2 serving as a Schottky gate electrode is formed, by deposition, on the entire major surface of semi-insulative GaAs substrate 1. A photoresist film is deposited on the resultant structure, to form a mask having a predetermined pattern, and an impurity (Si ions) is selectively implanted in substrate 1 through first metal film 2 using the mask, thereby forming ion-implantation region 3 serving as a channel layer.

FIG. 1B

After the photoresist mask is removed, a second metal film is formed on the first metal film and is selectively etched to form gate electrode lower portion 4. An impurity is implanted into high-concentration layer forming regions of substrate 1, which serve as a source and drain, through first metal film 2 using gate electrode lower portion 4 and the photoresist film having a predetermined pattern as a mask, thereby forming two n+-type ion-implantation regions 5, and 6.

FIG. 1C

An insulating film (not shown) is formed on the entire surface of the resultant structure, and annealing is performed using the insulating film, first metal film 2, and gate electrode lower portion 4 as a protective film, thereby activating ions implanted in ion-implantation regions 3, 5, and 6, and recovering crystallinity. Thus, ion-implantation regions 3, 5, and 6 are converted to channel layer 7, source n+-type layer 8, and drain n+-type layer 9, respectively. Thereafter, gate electrode upper portion 10, source electrode 11, and drain electrode 12 are formed, thereby completing an element formation process.

With this manufacturing method, since the surface of the channel layer is covered with the first metal film throughout the processes, it does not become oxidized, and will not become contaminated and degraded by noxious ions. Thus, an element having stable Schottky characteristics and FET characteristics can be obtained Since ion-implantation is performed through the first metal film, the influence of channeling is reduced as compared to a conventional method, and high-concentration impurity regions can be formed near the surface of the substrate. In addition, an FET having high and uniform mutual-conductance characteristics can be obtained.

In this manufacturing method, almost all the Si ions implanted in the semi-insulative GaAs substrate are activated by annealing, to be converted to effective donor ions. However, even if annealing is performed within a temperature range (about 800° C. to 850° C.) for maintaining the Schottky barrier characteristics of high-melting point metals, the activation ratio of the implanted ions can be as low as 50 to 80%, and electron mobility in the channel layer is decreased. This decreases mutual-conductance gm of the GaAs MES FET and lowers its high operation speed.

In general, impurity ions implanted in a crystal substrate have a distribution based on the LSS theory. However, in practice, the impurity ions cannot have the ideal distribution based on the LSS theory, but instead a distribution deviating slightly therefrom. This also applies to the substrate of the GaAs MES FET. Microscopically, the distribution of the impurity ions in wafers varies. Si ions implanted in a substrate comprising two elements, such as the GaAs substrate, do not all serve as donor ions, and their behavior in the substrate is complex. For this reason, when a channel layer is formed by ion-implantation, it is difficult to determine the thickness of the channel layer and an impurity concentration distribution according to a design value.

The Schottky barrier characteristic is stabilized by the method of manufacturing a GaAs MES FET proposed by the present inventors (Japanese Patent Application No. 60-212201). However, demand for improving various other characteristics of MES FETs has become very strong. In particular, since the MES FET is widely used as an element whose operation speed must be high, it is therefore important to improve its operation speed characteristics. The MES FET is used widely as a high-speed active element of a logic IC (integrated circuit). Since, however, as a high-speed active element, the GaAs MES FET circuit has a narrow dynamic range (the difference between high and low voltage levels), threshold voltage Vth of the GaAs MES FET must be precisely controlled. In other words, voltage Vth must be controlled to within a range of ±(50 to 100) mV among wafers or in a single wafer. In the GaAs MES FET, it is important that the operation speed characteristics and the controllability of threshold voltage Vth be improved, especially now that demand therefor has increased.

In the method proposed in JPA No. 60–212201, the channel layer is formed by ion-implanting an impurity in a GaAs substrate. However, the activation ratio of the implanted impurity ions is low, and hence, high electron mobility as the characteristic feature of the GaAs crystal is prevented, thereby lowering the high-speed operation. The strict requirement for threshold voltage Vth cannot be satisfied, since the thickness of the channel layer and the impurity concentration distribution cannot be stably controlled, as has been described above.

SUMMARY OF THE INVENTION

It is an object of the present invention to provide a method of manufacturing a GaAs MES FET which retains the advantages of the proposed method of manufacturing the GaAs MES FET and, in addition, can improve on the low activation ratio of the ions implanted in the channel layer and reduce the instability of the activation layer, thereby improving the operation speed of the GaAs MES FET and satisfying the Vth control requirements.

The method of manufacturing the MES FET according to the present invention includes the following four steps:

(STEP 1) In the first step, a GaAs epitaxial layer of one conductivity type (to be referred to as an n-type hereinafter, since an n-type is normally used) is formed on a semi-insulative GaAs substrate by means of the crystal growth technique controlled on the order of atomic layer level. A portion of the epitaxial layer serves as a channel layer.

Recent crystal growth techniques using molecular beam epitaxy (to be referred to as MBE hereinafter), metalorganic molecular beam epitaxy (to be referred to as MO-MBE hereinafter) or chemical vapor deposition using metalorganic compounds (to be referred to as MO-CVD hereinafter) are often described as a technique for overlapping atomic or molecular layers, one by one. The crystal growth technique which allows film-thickness control on the order of atomic layer level, and used in the present invention, employs these techniques, and film thickness can be controlled in units within several atomic layers. In this technique, the film thickness can be confirmed by measuring crystal growth rate, and the like.

(STEP 2) In the second step, a first metal film is formed on the entire surface region of the n-type GaAs epitaxial layer. In this step, the crystal growth technique which allows film-thickness control on the order of atomic layer level is used in the same manner as in STEP 1 (the same apparatus as in STEP 1 is also used), and follows the procedures shown in STEP 1. A portion of the first metal film serves as a Schottky gate electrode.

(STEP 3) The third step is an ion-implantation process in which an n-type high-concentration impurity is selectively ion-implanted in an $n^+$-type layer-forming region (such as a source or drain), through the first metal film.

(STEP 4) The fourth step is an activation annealing process wherein annealing is performed to activate the implanted ions after ion-implantation. This step is performed while the first metal film or a composite multilayered film comprising the first metal film and other films (e.g., a second metal film and an insulating film) is deposited on the epitaxial layer.

Using the method of manufacturing the MES FET of the present invention, the amount of crystal growth of a channel layer (n-type GaAs epitaxial layer) can be controlled on the order of atomic layer level. As a result, film thickness and impurity concentration distribution can be controlled with high precision, and a channel layer having uniform film thickness and impurity concentration distribution can be obtained.

When a Schottky gate electrode (first metal film) is formed on the channel layer, this film formation is performed in an ultra-high vacuum immediately after the formation of the channel layer, by utilizing the same crystal growth technique which allows control on the order of atomic layer level, as in the formation of the channel layer. Therefore, an oxide film or other noxious impurities are virtually absent on a Schottky interface between the gate electrode and the channel layer, the occurrence of an unstable interface level caused by crystal defects is extremely unlikely, and hence, a stable Schottky barrier can be obtained.

Since the implantation of ions in the $n^+$-type layer-forming region (serving as a source or drain) is performed through the first metal film, the first metal film serves as a protective barrier for preventing the substrate from being contaminated during ion-implantation. During ion-implantation, a high-concentration region is present in a portion slightly inward from the implanted surface, i.e., a slightly inner portion from the substrate surface. Therefore, since ion-implantation is performed through the first metal film, the high-concentration region is formed near the surface of the $n^+$-type layer-forming region, and as a result, the source and drain resistances can be reduced.

Since the activation annealing process following ion-implantation is carried out while at least the first metal film remains on the epitaxial layer, this can effectively prevent the occurrence of a punch-through phenomenon of As ions from the epitaxial layer during the annealing process.

According to the present invention, a method of manufacturing a MES FET is provided, comprising the steps of forming a GaAs epitaxial layer of one conductivity type, including a portion serving as a channel layer, on a semi-insulative GaAs substrate by use of a crystal growth technique which allows control on the order of atomic layer level, forming a first metal film including a portion serving as a Schottky gate electrode on the entire surface of the GaAs epitaxial layer, using the crystal growth technique which allows control on the order of atomic layer level, immediately after the epitaxial layer-forming step, ion-implanting a high-concentration impurity of the one conductivity type into source and drain high-concentration layer-forming regions, through the first metal film, and performing activation annealing, after the ion-implantation step, while at least the first metal film remains on the epitaxial layer.

BRIEF DESCRIPTION OF THE DRAWINGS

FIGS. 1A to 1C are sectional views of element structures in the principal processes in a conventional method of manufacturing a GaAs MES FET;

FIG. 3 is a sectional view showing a section of a semiconductor in which an isolation groove for isolating elements is formed;

FIGS. 4A and 4B are sectional views of element structures in the principal processes in a manufacturing method according to another embodiment of the present invention.

DETAILED DESCRIPTION OF THE PREFERRED EMBODIMENTS

Since a channel layer of a GaAs MES FET has a low film thickness, i.e., 1,000 Å or less, any change in the film thickness directly influences threshold voltage Vth. Since the dynamic range (theoretical amplitude) in a digital circuit of the GaAs MES FET is narrow, variations in threshold voltage Vth among elements is required to fall within a very narrow allowance of ±(50–100) mV. In order to satisfy this requirement, it is most important that the following two conditions are met:

(1) an impurity concentration distribution in the channel layer and its film thickness are constant and uniform; and (2) Schottky barrier characteristics of an interface between the channel layer and a gate electrode are stabilized. According to the present invention, in order to satisfy the above requirements, a channel layer is formed by a crystal growth method, such as MBE, MO-MBE, or MO-CVD, such that the crystal growth can be controlled on the order of atomic layer level. This method is very suitable for satisfying the requirement of item (1). In order to stabilize the Schottky barrier characteristics of the interface, a Schottky metal is subsequently stacked using the same technique as above, such as MBE or the like, on the surface of the channel layer which is formed by a technique such as MBE or the like, and which is not yet contaminated.

Figure 2A:
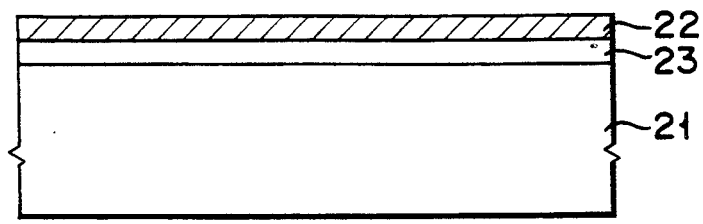
FIGS. 2A to 2C are sectional views of element structures in the principal processes in a method of manufacturing a GaAs MES FET according to an embodiment of the present invention.
Figure 2B:
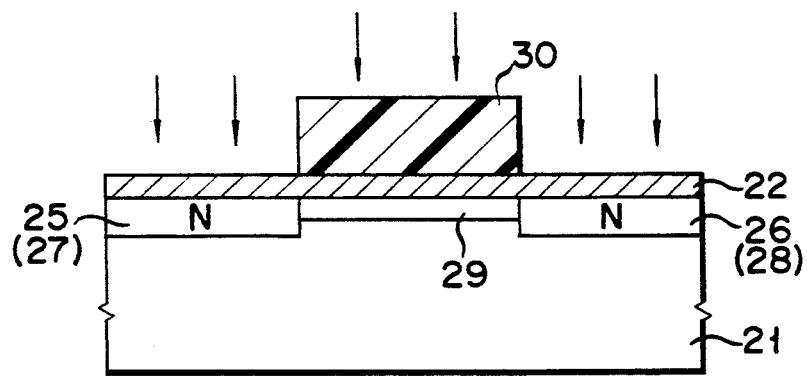
Figure 2C:
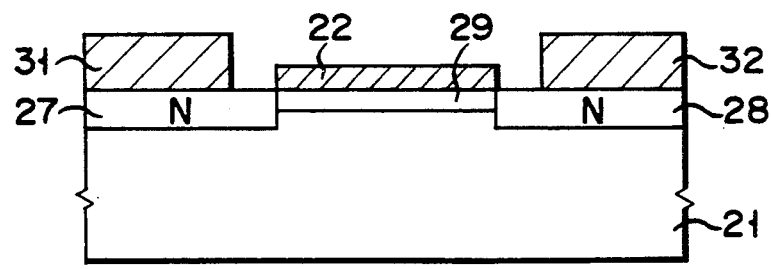

An embodiment of the present invention will be described hereinafter, with reference to the accompanying drawings. FIGS. 2A to 2C are sectional views of elements in the principal processes of the manufacturing method of the GaAs MES FET according to the present invention.

FIG. 2A

N-type GaAs epitaxial layer 23 having a thickness of 1,000 Å or less is formed on semi-insulative GaAs substrate 21 having a resistivity of $10^{+7}$ Ωcm or higher, by a technique of overlapping atomic layers one by one using an MBE, MO-MBE, or MO-CVD crystal growth apparatus. A donor concentration of epitaxial layer 23 is determined by target values of the film thickness of epitaxial layer 23 and threshold voltage Vth, and is set to fall within the range of $10^{15}$ to $10^{18}$ atoms/cm$^2$.

First metal film 22 is formed on the entire surface of epitaxial layer 23, immediately after formation of epitaxial layer 23, by the same apparatus as above, so as to have a thickness of 1,000 Å or less. First metal film 22 comprises, for example, a (high-melting point) metal compound such as tungsten silicide (WSi$_x$) or tungsten nitride (WN$_x$). A portion of the first metal film serves as a Schottky gate electrode in the later process. The source-drain ion-implantation process and the activation annealing process (to be performed later) are performed while the first metal film still remains on epitaxial layer 23. The film thickness of the first metal film is set to be 1,000 Å A or less, in order to facilitate the subsequent ion-implantation process. The film thickness is selected to be 1,000 Å or less so that the first metal film can serve as a stopper for reactive ion etching (to be referred to as RIE hereinafter) and can also serve as a protective layer for preventing an As ion punch-through phenomenon from occurring during the activation annealing process. Of course, it is important that the film thickness is satisfactorily uniform and that no pin holes are formed.

FIG. 2B

As is shown in FIG. 2B, resist pattern 30 is formed on a portion of first metal film 22 which serves as the gate electrode. An n$^+$-type impurity is selectively ion-implanted in n$^+$-type layer-forming regions 25 and 26, respectively serving as a source and drain, through first metal film 22, using resist pattern 30 as a mask.

While the first metal film still remains on epitaxial layer 23, the resultant structure is annealed at a temperature of about 800° C., using it as a protective film, thereby activating implanted ions and recovering crystals. In this way, n$^+$-type layers 27 and 28 serving respectively as the source and drain are formed, and the channel length of channel layer 29 is thus determined. Note that annealing is performed by capless annealing, cap annealing, or lamp annealing.

FIG. 2C

A mask (not shown) such as a resist film is formed on a portion of first metal film 22 which serves as the gate electrode, and other portions of metal film 22 are etched using an RIE apparatus or the like, thereby forming gate electrode 22. Thereafter, AuGe ohmic metal films which are in ohmic contact with n$^+$-type layers 27 and 28 serving respectively as the source and drain are formed by a known method, thereby forming source and drain electrodes 31 and 32, respectively. In addition, a wiring process is performed to complete the GaAs MES FET element.

In the case of a GaAs IC (integrated circuit), the performing an element isolation process for respective MES FETs is necessary. As is shown in FIG. 3, a process for etching the GaAs substrate to a depth of 0.2 μm is employed to form isolation groove 33. If necessary, insulating material 34 can be buried in the isolation groove.

The MES FET has a response delay time of a signal proportional to the product of the sheet resistance and the capacitance of the gate electrode. For example, WSi$_x$ or WN$_x$ as the gate electrode material has a resistivity of 100 to 200 Ωcm, and if a high-speed operation is required, the above delay time cannot be ignored. In particular, when a gate width is to be increased so as to obtain a large current, the delay time is prolonged in accordance with an increase in the capacitance of the gate electrode, and the operation speed is decreased.

After the activation annealing process, a second metal film is additionally formed on only a portion of the first metal film which serves as the metal film, to reduce the sheet resistance and to increase the operation speed. More specifically, as is shown in FIG. 4A, second metal film 24 is formed on the entire major surface of first metal film 22. As is shown in FIG. 4B, the first and second metal films are patterned to leave them on only the gate portion. Second metal film 24 preferably has as low a resistivity as possible. A metal whose molecules do not punch through the first metal film, i.e., Schottky gate electrode 22, during the annealing process (400 to 450° C.) upon formation of the AuGe ohmic electrodes, for example, a high-melting point metal such as W (tungsten), Mo (molybdenum), or Ti (titanium) is preferable as metal film 24. When the sheet resistance of the gate electrode has to be decreased, a multi-layered structure can be adopted wherein a Ti film having a strong barrier effect is formed on Schottky gate electrode 22, and a metal film such as Pt (platinum) or Au (gold) is formed thereon. Second metal film 24 is not always limited to a single-layer structure, but can be a multi-layered structure.

When W, Mo, Ti, or the like is used as the metal of second metal film 24, the resultant structure can withstand annealing at high temperatures (800° to 850° C.). Therefore, after the ion-implantation process is performed for n$^+$-type layer-forming regions 25 and 26 for the source and drain, and second metal film 24 is formed on the entire surface of first metal film 22, the activation annealing process can be performed while first and second metal films 22 and 24 remain on substrate 21. This is because the As ion punch-through-prevention effect of the protective film can be enhanced during the activation annealing process. However, during annealing, if first and second metal films are stacked on each other and the total film thickness is increased, the films may begin to peel off or else threshold voltage Vth may vary due to the large stress acting on the film during annealing. In the three embodiments described above, the source and drain high-concentration layers and the gate region require a margin to be allowed for misalignment upon mask alignment. This results in the necessity for a large wafer size.

In order to eliminate the above drawbacks, after the process of forming first metal film 22 is performed and second metal film 24 is formed thereon, second metal film 24 is selectively etched by RIE so as to leave only a portion of second metal film 24 remaining on a portion of first metal film 22 serving as the gate electrode. Thereafter, ion-implantation for the source and drain is performed, followed by activation annealing. In this case, second metal film 24 is preferably has an RIE condition different from that applied to first metal film 22. More specifically, second metal film 24 preferably comprises a metal which is not etched under the same RIE condition as in first metal film 22. Second metal film 24 may preferably comprise Mo. Using this method, the source and drain high-concentration layers can be formed using the remaining second metal film 24 as a mask in a self-alignment mode, and hence, the margin allowed for misalignment during mask alignment can be reduced. With this method, the sheet resistance of the gate electrode can be reduced, and the effect for the prevention of As ion punch-through from the channel layer during annealing can be improved. In addition, since second metal film 24 is formed on only a portion of first metal film 22 serving as the gate electrode, thermal stress generated during annealing can be reduced.

Figure 5:
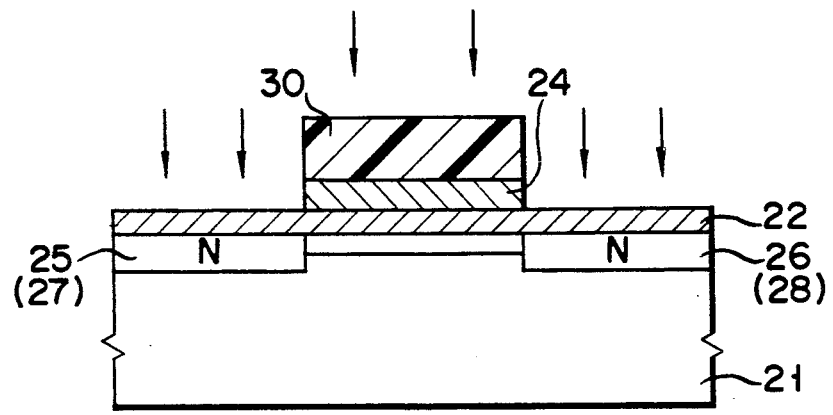
FIGS. 5, 6, and 7 are sectional views of element structures in the principal processes in a manufacturing method according to yet another embodiment of the present invention.
Figure 6:
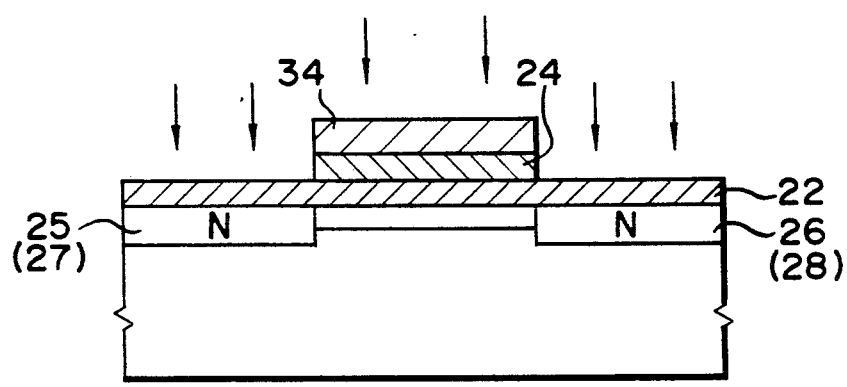

FIGS. 5 and 6 show an embodiment of a method of manufacturing a MES FET, using a self-alignment mode.

First metal film 22 is formed on substrate 21. Then, second metal film 24 is formed on metal film 22. Second metal film 24 is selectively etched by RIE, using resist film 30 as a mask, so as to leave a portion which serves as the gate electrode. Thereafter, as is shown in FIG. 5, ion-implantation for source and drain high-concentration layer-forming regions 25 and 26 is performed, using a multi-layered film consisting of second metal film 24 and resist film 30 as a mask.

After first and second metal films 22 and 24 are formed, a silicon nitride film is formed as insulation film 34 by plasma CVD or a silicon oxide film is formed as insulation film 34 by CVD, on second metal film 24. A photoresist film having a predetermined pattern is formed on insulating film 34, and insulating film 34 is selectively etched by RIE, using a suitable gas, so as to leave it only on the gate electrode. After the photoresist film is removed, second metal film 24 is etched, using insulating film 34 as a mask in turn, by RIE, using another gas. In this way, a gate portion of second metal film 24 is left only on the gate portion. Thereafter, as is shown in FIG. 6, ion-implantation for source and drain high-concentration layer-forming regions 25 and 26 is performed, using a multi-layered film comprising second metal film 24 and insulating film 34 as a mask.

Which of the methods shown in FIGS. 5 and 6 is selected is determined depending on a material such as a resist, an insulating film, or the like, which itself is determined by the material of second metal film 24 during the RIE process. In the methods shown in FIGS. 5 and 6, source and drain high-concentration layers are formed to be self-aligned with the gate electrode. This causes mutual-conductance gm to increase and further improves the operation speed.

In the above-mentioned activation annealing process, capless annealing, carried out in an arsino gas atmosphere using a metal film as an annealing protective film, is adopted. In this case, a maximum protection effect of a metal film may be provided. While this method involves simple and straightforward processes, it is, however, a somewhat dangerous method, since arsino gas is used.

Figure 7:
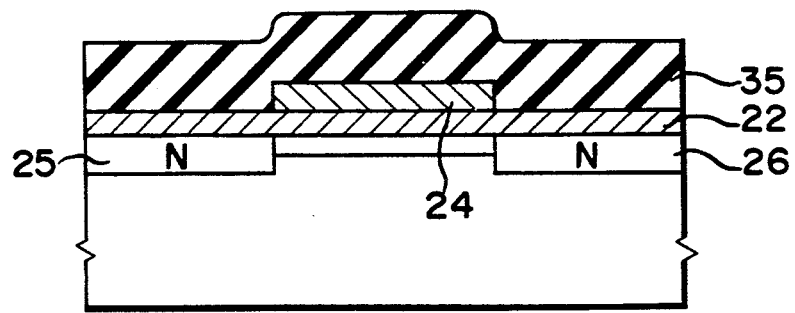

For this reason, as is shown in FIG. 7, cap annealing is performed instead. More specifically, annealing is performed while a silicon dioxide film containing phosphorus, a silicon dioxide film containing arsenic, a silicon dioxide film containing both phosphorus and arsenic, or a silicon nitride film containing neither phosphorus nor arsenic is formed on metal films 22 and 24, as protective film 35.

In the method of manufacturing the GaAs MES FET according to the present invention, a channel layer is formed by use of a crystal growth technique which allows control on the order of atomic layer level. Thus, the incidence of either crystal breakdown, when ions are implanted in a GaAs substrate to form a channel layer, or a decrease in electron mobility, caused by a low activation ratio of implanted ions, can be prevented. In addition, non-uniformity in the thickness of the channel layer and instability of the impurity concentration distribution, caused by variations in ion distribution due to the channeling effect of the implanted ions or complex behavior of implanted Si ions, can be greatly reduced. The thickness of the channel layer and the impurity concentration distribution can be controlled to be substantially constant values, and all the impurities are converted to donors. As a result, mutual-conductance gm of the element can be increased as compared to a conventional method, and the operation speed can be further increased.

In the manufacturing method of the present invention, since the channel layer and the metal film for the gate electrode are formed in succession in an ultra-high vacuum, foreign matter such as contaminants are virtually absent on an interface therebetween, and a Schottky barrier having stable characteristics can always be obtained. This allows the formation of a channel layer having uniform film thickness and impurity concentration, and the controlling of variations in threshold voltage Vth among elements to fall within several tens of millivolts.

The first metal film is used as a protective film during ion-implantation for forming source and drain high-concentration layers, to prevent them from being contaminated by ion-implantation. The annealing process is performed while the metal film remains on the substrate, to prevent an As ion punch-through phenomenon. In this manner, the method of the present invention also retains the advantages of the conventional technique.

Controllability of threshold voltage Vth can be improved to a satisfactory level, and the high-speed operation of the GaAs MES FET can be assured.

What is claimed is:

1. A method of manufacturing a MES FET, comprising the steps of:
   (a) forming a GaAs epitaxial layer of one conductivity type including a portion serving as a channel layer on a semi-insulative GaAs substrate, by use of a crystal growth technique which allows control at atomic layer level;
   (b) forming a first metal film including a portion serving as a Schottky gate electrode on the entire surface of said GaAs epitaxial layer, using the crystal growth technique which allows control at atomic layer level, immediately after the epitaxial layer-forming step and using an apparatus which is the same apparatus used in forming said GaAs epitaxial layer;
   (c) ion-implanting a high-concentration impurity of the one conductivity type into source and drain high-concentration layer-forming regions, through said first metal film;
   (d) forming a second metal film on the entire surface of said first metal film;
   (e) performing activation annealing, after the ion-implanting step, while said first and second metal films remain on said epitaxial layer; and
   (f) patterning said first metal film to form said Schottky gate electrode by selectively etching said first metal film after activation annealing.

2. A method according to claim 1, wherein the activation annealing is a capless annealing step which is performed in an arsino gas atmosphere.

3. A method according to claim 1, wherein the activation annealing is a cap annealing step wherein after a silicon oxide film, containing at least one element selected from the group consisting of phosphorus ions and arsenic ions, or a silicon nitride film containing neither of these ions, is formed on the substrate on which said first metal and second films are formed before the activation annealing step, the annealing is performed using said silicon oxide film or said silicon nitride film as a protective film.

* * * * *